United States Patent [19]
Lee

[11] Patent Number: 5,623,452
[45] Date of Patent: Apr. 22, 1997

[54] DUAL PORT MEMORY DEVICE

[75] Inventor: Jang-Kyu Lee, Kyungki-do, Rep. of Korea

[73] Assignee: Samsung Electronics Co., Ltd., Suwon, Rep. of Korea

[21] Appl. No.: 342,049

[22] Filed: Nov. 17, 1994

[30] Foreign Application Priority Data

Nov. 17, 1993 [KR] Rep. of Korea ............... 24481/1993

[51] Int. Cl.⁶ ................................................. G11C 8/00
[52] U.S. Cl. ............... 365/230.05; 365/221; 365/230.03; 365/230.09
[58] Field of Search ............. 365/230.05, 230.03, 365/230.09, 221, 239

[56] References Cited

U.S. PATENT DOCUMENTS

| | | |
|---|---|---|
| 5,138,581 | 8/1992 | Miyamoto et al. ............... 365/230.05 |
| 5,249,165 | 9/1993 | Toda ............................... 365/230.05 X |
| 5,377,154 | 12/1994 | Takasugi ................................. 365/221 |
| 5,377,157 | 12/1994 | Matsumoto et al. .............. 365/230.05 |

Primary Examiner—Son T. Dinh
Attorney, Agent, or Firm—Allen LeRoy Limberg

[57] ABSTRACT

A dual port memory device having a plurality of memory blocks which are divided from a memory cell array formed on same semiconductor substrate comprises a first memory block which shares a RAM port with a second memory block adjacent to one part thereof and also shares a SAM port with a third memory block adjacent to the other part thereof.

18 Claims, 3 Drawing Sheets

DUAL PORT MEMORY DEVICE

BACKGROUND OF THE INVENTION

The present invention relates to a dual port memory device, and more particularly to the dual port memory device which commonly has a SAM (Serial Access Memory) port performing an input/output operation of serial data between a plurality of memory blocks and a RAM (Random Access Memory) port performing the input/output operation of random data.

Recently, the memory device has had large capacity. A method for reducing operative current by driving a plurality of memory blocks which are separated from a memory cell, has been developed. In such memory device, a specific memory block is enabled by an address signal applied from the out of the memory device. Further, a data access operation is performed via a sense amplifier and I/O lines provided to each of the memory blocks. Thereby, the more the memory device is subdivided into a plurality of memory blocks, the more the sense amplifier and the I/O lines associated with the input/output of data are increased and also occupy a wide region. This is more serious in the memory device having large capacity. Therefore, in order to solve this problem, an art that the memory blocks adjacent to each other have commonly one sense amplifier and the I/O lines is disclosed in the U.S. Pat. No. 5,014,246 issued in 1991.

The SAM and RAM ports should be provided to each of the memory blocks so that the dual port memory device which has the SAM port performing the data input/output operation in serial and the RAM port performing the data input/output operation in random, can be separately driven by the block. An art that the memory block has commonly the SAM port with the other memory block adjacent thereto is disclosed in the U.S. Pat. No. 4,984,214 issued in 1991.

As a construction view of a memory block of a dual port memory device according to the conventional art, FIG. 1 shows that the memory blocks adjacent to each other have commonly the SAM port.

Referring to FIG. 1, the two adjacent memory blocks 10 and 12 commonly include the SAM port 14 and a serial data I/O line and also have the RAM ports 16 and 18. The memory block 10 performs a random access operation through the RAM port 16 and performs a serial access operation through the SAM port 14. Further, the memory block 12 performs the random access operation through the RAM port 18 and performs the serial access operation through the SAM port 14 which is commonly included in the adjacent memory block 10. The dual port memory device shown in FIG. 1 is formed by the repeated construction of the two memory blocks which each have the RAM port and commonly have the SAM port. Therefore, the number of SAM ports is reduced by the half of the number of memory blocks.

However, the conventional dual port memory device shown in FIG. 1 has the RAM port which corresponds to the memory block one by one. Thereby, there aries a problem that the RAM port still occupies wide region, even if the number of SAM ports is reduced. This makes high integrated memory devices disadvantageous.

SUMMARY OF THE INVENTION

It is therefore an object of the present invention to provide a dual port memory device to enhance the integrated density of a memory device by reducing the region of a peripheral circuit.

It is another object of the present invention to provide a dual port memory device having memory blocks which have commonly a SAM and RAM ports with the adjacent memory block.

According to an aspect of the objects of the present invention, the dual port memory device comprising a plurality of memory blocks for separating and operating a memory cell array is characterized in that each of the memory blocks has the SAM port in one part and also has the RAM port in the other part.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

The embodiment of the present invention will be explained with reference to FIGS. 2 and 3. In the following description, numerous specific details such as the number of memory blocks are set forth to provide a more thorough understanding of the present invention. It will be apparent, however, to one skilled in the art, that the present invention may be practiced without these specific details.

Figure 1:
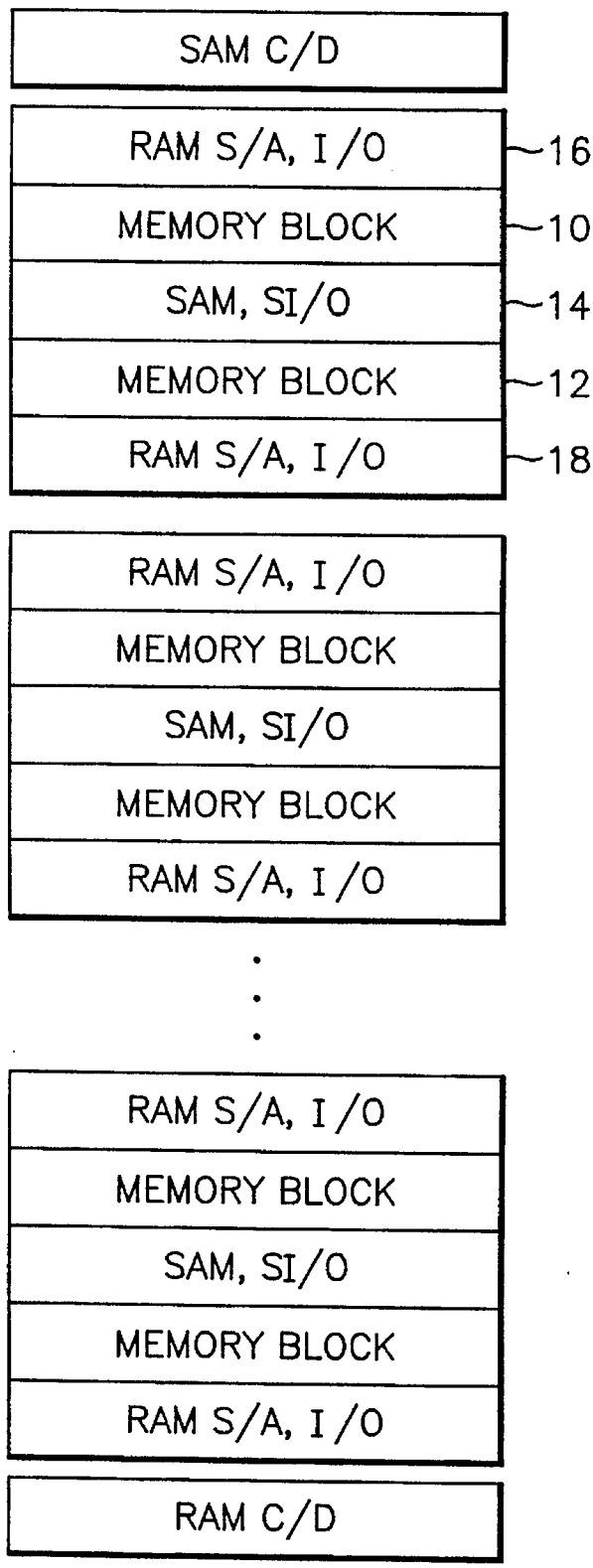
FIG. 1 is a construction view of a memory block of the conventional dual port memory device and shows that adjacent memory blocks have commonly a SAM port.
Figure 2:
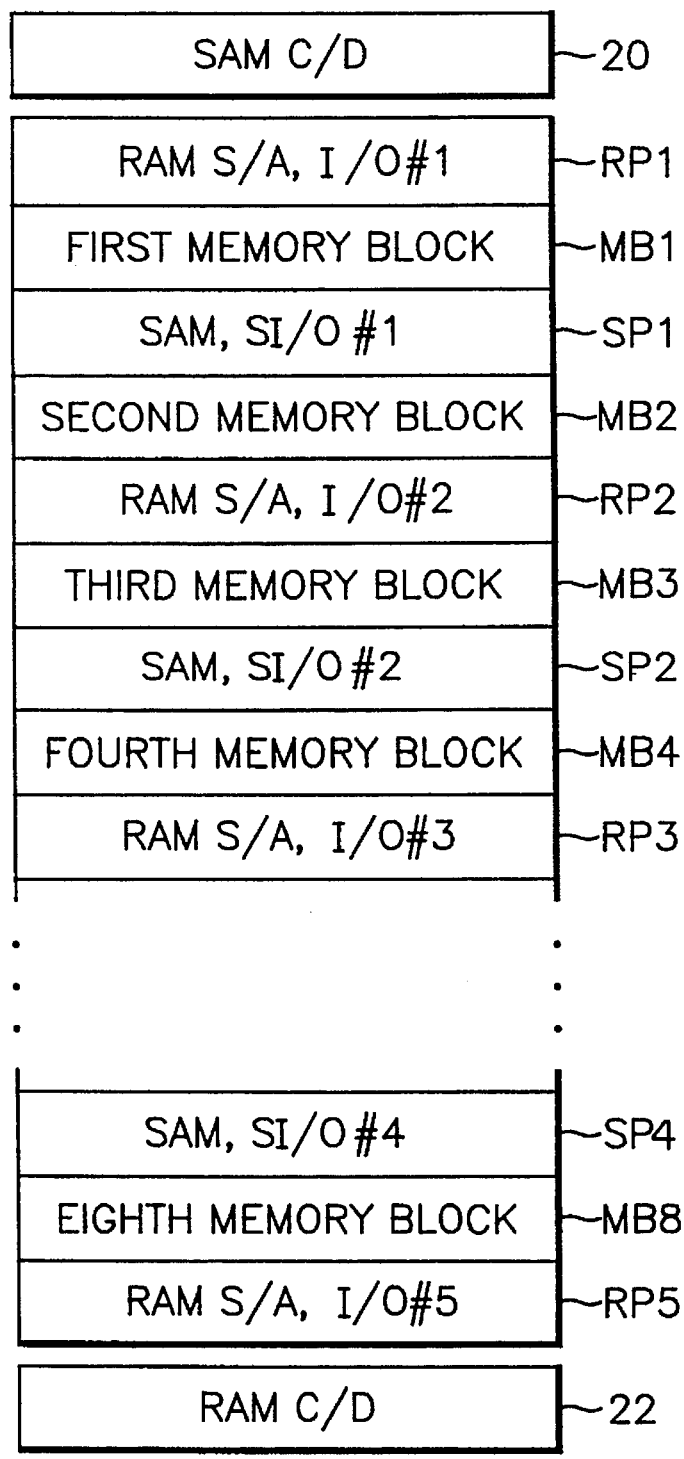
FIG. 2 is a construction view of a memory block of a dual port memory device according to the present invention and shows that one memory block has commonly a SAM port with the other memory block adjacent to one part and has commonly a RAM port with another memory block adjacent to the other part.

As a construction view of a memory block of the dual port memory device according to the present invention, FIG. 2 shows that each of a plurality of memory blocks formed on the same substrate has commonly the SAM port with the other memory block adjacent to one part and also has commonly the RAM port with another memory block adjacent to the other part. FIG. 3 shows the relationship that the adjacent memory blocks have commonly the RAM and SAM ports.

Referring to FIG. 2, the memory cell array is divided into eight memory blocks MB1~MB8. One of the SAM ports SP1~SP4 is arranged in one part of the memory block and one of the RAM ports RP1~RP5 is arranged in the other part thereof. Each of the SAM ports SP1~SP4 is commonly controlled by a SAM column decoder 20 and each of the RAM ports RP1~RP5 is commonly controlled by a RAM column decoder 22. The RAM port RP1 is positioned at one part of a first memory block MB1, whereas the SAM port SP1 is positioned between another part of the first memory block MB1 and a second memory block. The RAM port RP2 is positioned between the second memory blocks MB2 and a third memory block MB3. The SAM port SP2 is positioned between the third memory block MB3 and a fourth memory block MB4. That is, the memory device shown in FIG. 2 is arranged according to the order of the RAM port→the memory block→the SAM port→the memory block. At a result, the second memory block MB2 has commonly the SAM port SP1 with the first memory block MB1 and also has commonly the RAM port RP2 with the third memory block MB3. In the same manner, the third memory block MB3 has commonly the RAM port RP3 with the fourth memory block MB4. The first to eighth memory blocks MB1 to MB8 perform the random access by the RAM ports RP1 to RP5 corresponding to the eight memory blocks one by one. In total construction of the memory device, the memory cell array is divided into eight memory blocks, each of which performs the serial input/output operation via one of four SAM ports and also performs the random access operation via one of five RAM ports. Therefore, there arises a merit that the number of RAM ports is reduced according to the reduction of the number of SAM ports. This merit makes the high integrated memory device advantageous in driving more memory blocks which are divided from the memory cell array. In a modification of the FIG. 2 dual port memory device, the positions of the SAM ports and the RAM ports are interchanged.

Figure 3:
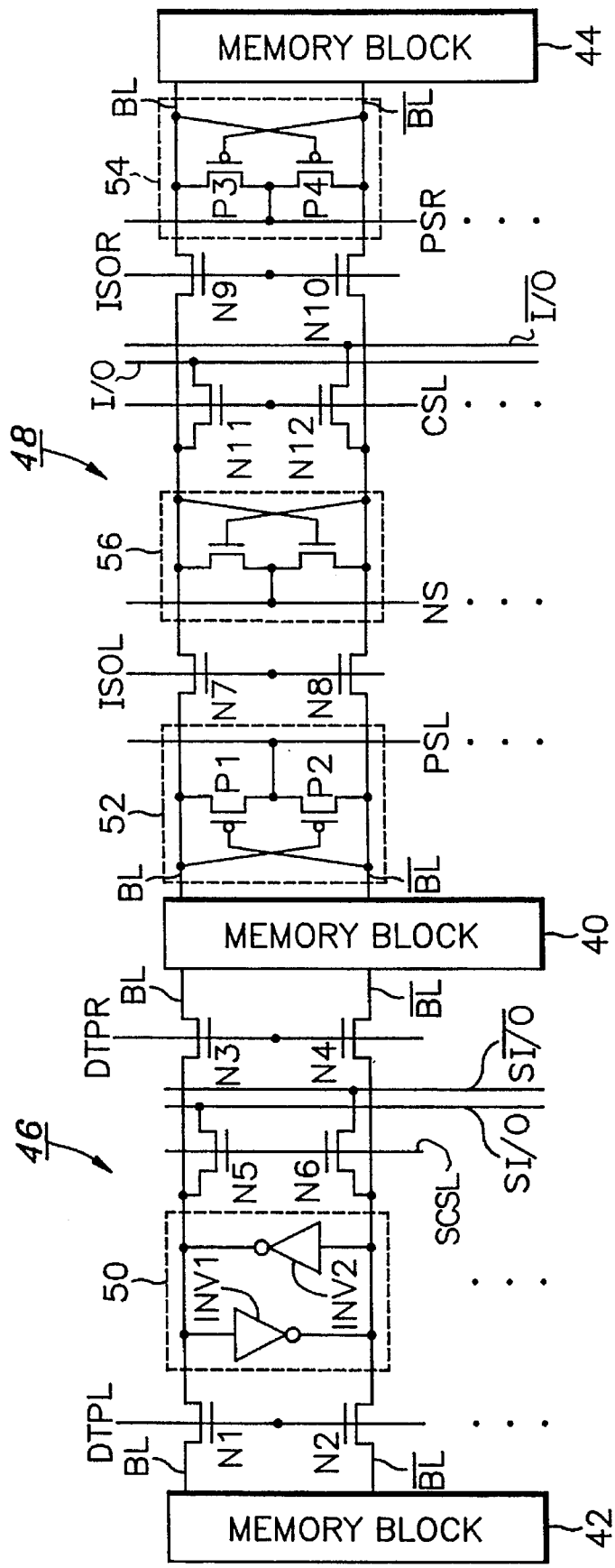
FIG. 3 is a detailed view showing the relationship that the adjacent memory blocks of FIG. 2 have commonly a SAM and RAM ports.

FIG. 3 shows in detail that the SAM and RAM ports are commonly included between the memory blocks adjacent to each other. Referring to FIG. 3, the memory block 40 has commonly the SAM port 46 with a memory block 42 adjacent to the left of the memory block 40 and also has commonly the RAM port 48 with a memory block 44 adjacent to the right thereof.

The SAM port 46 is composed of a SAM 50 consisting of two inverters INV1 and INV2 whose input and output are alternatively connected to two input/output terminals, operating as latch means; N-channel transistors N1 and N2 controlled by a first data transfer signal DTPL at gates thereof and connecting a pair of bit lines BL/$\overline{BL}$ of the memory block 42 to each of the input/output terminals of the SAM 50 one by one via a channel thereof; N-channel transistors N3 and N4 controlled by a second data transfer signal DTPR at gates thereof and connecting the pair of bit lines BL/$\overline{BL}$ of the memory block 40 to each of the input/output terminals of the SAM 50 one by one via the channel thereof; and N-channel transistors N5 and N6 controlled by a SAM column selection signal SCSL at gates thereof and connecting each of the input/output terminals to a pair of serial data input/output lines SI/O and $\overline{SI/O}$ one by one. The first and second data transfer signals are enabled complementally. Thereby, data output from the memory block 42 or the memory block 40 is selected and then is latched to the SAM 50.

The RAM port 48 is composed of PMOS sense amplifiers 52 and 54 which correspond to the pair of bit lines BL/$\overline{BL}$ of the memory blocks 40 and 44 one by one; a NMOS sense amplifier 56 being commonly connected to the bit lines via each of isolation transistors N7, N8, N9, and N10; and N-channel transistors N11 and N12 controlled by a column selection signal CSL at gates thereof and connecting both of the channel terminals to the bit lines BL and $\overline{BL}$ and the data output lines I/O and $\overline{I/O}$. A first isolation signal ISOL applied to gates of the isolation transistors N7 and N8 which are positioned between the PMOS sense amplifier 52 connected to the memory block 40 and the NMOS sense amplifier 56, and a second isolation signal ISOR applied to gates of the isolation transistors N9 and N10 which are positioned between the PMOS sense amplifier 54 connected to the memory block 44 and the NMOS sense amplifier 56 are enabled complementally. Thereby, data output from the memory block 40 or the memory block 44 is transmitted to the input/output lines I/O and $\overline{I/O}$.

The memory block 40 is selected for the data access operation in FIG. 3.

First of all, in the serial access operation, since the pair of bit lines of the memory block 40 is connected to the input/output terminals of the SAM 40, whereas the pair of bit lines of the memory block 42 is isolated from the input/output terminals thereof, the first data transfer signal DTPL is applied to the logic low level (hereafter, is called the low level for short) and the second data transfer signal DTPR is applied to the logic high level (hereafter, is called the high level for short). Therefore, the N-channel transistors N1 and N2 are turned off and the other N-channel transistors N3 and N4 are turned on, so that the input/output terminals of the SAM 50 are connected to the pair of bit lines of the memory block 40. Then, the SAM column selection signal SCSL is provided as the high level, the N-channel transistors N5 and N6 are turned on. Thereby, the data access operation is performed between the pair of serial data input/output lines SI/O and $\overline{SI/O}$ and the pair of bit lines of the memory block 40.

Next, in the random access operation, the first isolation signal ISOL is provided as the high level and the second isolation signal ISOR is provided as the low level so as to perform the access operation of the memory block 40. Thereby, the gates of the isolation transistors N7 and N8 are turned on and the other gates thereof are turned off. Then, if the column selection signal CSL is provided as the high level, the NMOS transistors N11 and N12 are turned on. Thereby, the pair of bit lines BL and $\overline{BL}$ of the memory block 40 are each connected to the data input/output lines I/O and $\overline{I/O}$. The PMOS sense amplifier 52 connected between the bit lines BL and $\overline{BL}$ and NMOS sense amplifier 56, perform a sensing amplification operation in response to the logic levels of control signals PSL and NS.

As mentioned above, one memory block has commonly the RAM port with the other memory block adjacent to one part, and also has commonly the SAM port with another memory block adjacent to the other part. Two memory blocks positioned at the most external region of the memory blocks which are serial on plane, perform the access operation in response to the SAM and RAM ports.

Accordingly, according to the present invention, there is an efficiency capable of raising the integrated density of the memory block due to the reduction of the number of SAM and RAM ports. Owing to this efficiency, the more the number of memory blocks obtained by dividing the memory cell array is increased, the more the integrated density of the memory block is advantageous.

What is claimed is:

1. A dual port memory device having a plurality of memory blocks which are divisions of a memory cell array formed on a single substrate of a semiconductive material, said device comprising a first memory block which shares a SAM port with a second memory block adjacent to a first side of said first memory block and which further shares a RAM port with a third memory block adjacent to a second side of said first memory block.

2. A dual port memory device having a plurality of memory blocks which are divisions of a memory cell array formed on a single substrate of a semiconductive material said device comprising a first memory block which shares a SAM port with a second memory block adjacent to a first side of said first memory block and which further shares a RAM port with a third memory block adjacent to a second side of said first memory block, wherein said SAM port comprises:

first and second serial data input/output lines;

a plurality of latch means, each of said latch means corresponding to a respective data output of said first memory block, corresponding to a respective data output of said second memory block, and having respective first and second data input/output terminals;

first switching means for selectively connecting each of said corresponding data outputs of said first memory block between the first and second data input/output terminals of its corresponding one of said latch means responsive to a first data transfer signal;

second switching means for selectively connecting each of said corresponding data outputs of said second memory block between the first and second data input/output terminals of its corresponding one of said latch means responsive to a second data transfer signal;

third switching means for connecting the first input/output terminal of a selected one of said plurality of latch means with said first serial data input/output line, as selected in response to a SAM column selection signal; and fourth switching means for selectively connecting the second input/output terminal of the one of said plurality of latch means selected in response to said SAM column selection signal with said second serial data input/output line.

3. A dual port memory device comprising:

a plurality of memory blocks which are divisions of a memory cell array formed on a single substrate of a semiconductive material, each memory block having a plurality of respective bit lines and having a plurality of respective word lines;

a SAM port shared by a first of said memory blocks and by a second of said memory blocks adjacent to a first side of said first memory block;

a RAM port shared by said first said memory blocks and by a third of said memory blocks adjacent to a second side of said first memory block, wherein said RAM port comprises:

a first random-access data input/output line;

a respective sense amplifier for each of said bit lines of said first and third memory blocks, said bit lines of said first memory block providing a first set of bit lines and said bit lines of said second memory block providing a second set of bit lines;

first switching means for conditionally connecting one of said bit lines of each of said first and third memory blocks to said first data input/output line, the bit lines being selected for conditional connection to said first data input/output line in response to a RAM column selection signal;

second switching means provided between said first switching means and said bit lines of said first memory block, said second switching means conditioned by a first isolation signal to complete the conditional connection of the selected bit line of said first memory block to said first data input/output line; and third switching means provided between said first switching means and said bit lines of said third memory block, said third switching means conditioned by a second isolation signal to complete the conditional connection of the selected bit line of said third memory block to said first data input/output line.

4. A dual port memory device as claimed in claim 3, including a RAM column decoder for generating said RAM column selection signal in response to a RAM column address.

5. A dual port memory device comprising:

a plurality of memory blocks which are divisions of a memory cell array formed on a single substrate of a semiconductive material, each memory block having a plurality of respective bit lines and having a plurality of respective word lines;

a SAM port shared by a first memory blocks and by a second of said memory blocks adjacent to a first side of said first memory block;

a RAM column decoder for generating a RAM column selection signal in response to a RAM column address;

a RAM port shared by said first of said memory blocks and by a third of said memory blocks adjacent to a second side of said first memory block, wherein said RAM port comprises:

a first random-access data input/output line;

a respective sense amplifier for each of said bit lines of said first and third memory blocks, said bit lines of said first memory providing a first set of bit lines and said bit lines of said second memory block providing a second set of bit lines;

first switching means for conditionally connecting one of said bit lines of each of said first and third memory blocks to said first data input/output line the bit lines being selected for conditional connection to said first data input/output line in response to said RAM column selection signal;

second switching means provided between said first switching means and said bit lines of said first memory block, said second switching means conditioned by a first isolation signal to complete the conditional connection of the selected bit line of said first memory block to said first data input/output line;

third switching means provided between said first switching means and said bit lines of said third memory block said third switching means conditioned by a second isolation signal to complete the conditional connection of the selected bit line of said third memory block to said first data input/output line; and a respective further sense amplifier for each pair of bit lines, one in said first set and the other in said second set that are selected for conditional connection to said first random-access data input/output line by the same said RAM column selection signal applied to said first switching means, said respective further sense amplifier located on the other side of said first switching means from said first random-access data input/output line.

6. A method of operating a dual port memory device having a plurality of memory blocks which are divisions of a memory cell array formed on a single substrate of a semiconductive material, each memory block having a plurality of respective bit lines and having a plurality of respective word lines;

a SAM port shared by a first of said memory blocks and by a second of said memory blocks adjacent to a first side of said first memory block;

a RAM column decoder for generating a RAM column selection signal in response to a RAM column address; and a RAM port shared by said first of said memory blocks and by a third of said memory blocks adjacent to a second side of said first memory block, wherein said RAM port comprises a first random-access data input/output line, a respective sense amplifier for each of said bit lines of said first and third memory blocks, first switching means for conditionally connecting one of said bit lines of each of said first and third memory blocks to said first data input/output line in response to said RAM column selection signal, second switching means provided between said first switching means and said bit lines of said first memory block and conditioned by a first isolation signal to complete the conditional connection of the selected bit line of said first memory block to said first data input/output line, and third switching means provided between said first switching means and said bit lines of said third memory block and conditioned by a second isolation signal to complete the conditional connection of the selected bit line of said third memory block to said first data input/output line; said method including the steps of:

selectively supplying one of said first and said second isolation signals; and simultaneously generating RAM column selection signal with said RAM column decoder for application to said first switching means.

7. A dual port memory device comprising:

a plurality of memory blocks which are divisions of a memory cell array formed on a single substrate of a semiconductive material, each memory block having a plurality of respective bit lines, having a plurality of respective complementary bit lines and having a plurality of respective word lines;

a SAM port shared by a first of said memory blocks and by a second of said memory blocks adjacent to a first side of said first memory block;

a RAM column decoder for generating a RAM column selection signal in response to a RAM column address;

a RAM port shared by said first of said memory blocks and by a third of said memory blocks adjacent to a second side of said first memory block, wherein said RAM port comprises:

a first random-access data input/output line;

a second random-access data input/output line for signals complementary to those on said first random-access data input/output line;

a respective sense amplifier for each of said bit lines of said first and third memory blocks and its complementary bit line, said bit lines of said first memory block providing a first set of bit lines and said bit lines of said second memory block providing a second set of bit lines;

first switching means for conditionally connecting one of said bit lines of each of said first and third memory blocks to said first data input/output line, the bit lines being selected for conditional connection to said first data input/output line in response to said RAM column selection signal;

second switching means provided between said first switching means and said bit lines of said first memory block, said second switching means conditioned by a first isolation signal to complete the conditional connection of the selected bit line of said first memory block to said first data input/output line;

third switching means provided between said first switching means and said bit lines of said third memory block, said third switching means conditioned by a second isolation signal to complete the conditional connection of the selected bit line of said third memory block to said first data input/output line;

fourth switching means for conditionally connecting one of said complementary bit lines of each of said first and third memory blocks to said second data input/output line, the ones of the complementary bit lines selected for conditional connection to said second data input/output line being selected in response to said RAM column selection signal;

fifth switching means provided between said fourth switching means and said complementary bit lines of said first memory block, said fifth switching means conditioned by said first isolation signal to complete the conditional connection of the selected complementary bit line of said first memory block to said second data input/output line; and sixth switching means provided between said fourth switching means and said complementary bit lines of said third memory block, said sixth switching means conditioned by said second isolation signal to complete the conditional connection of the selected complementary bit line of said third memory block to said second data input/output line.

8. A dual port memory device as claimed in claim 7, further comprising:

a respective further sense amplifier for each pair of bit lines, one in said first set and the other in said second set that are selected for conditional connection to said first random-access data input/output line by the same RAM column selection signal applied to said first switching means, and for their complementary bit lines, said respective further sense amplifier located on the other sides of said first and fourth switching means from said first and second random-access data input/output lines.

9. A dual port memory device as claimed in claim 2, including a SAM column decoder for generating said SAM column selection signal in response to a SAM column address.

10. A method of operating said dual port memory device as claimed in claim 9, including the steps of:

selectively connecting with said first switching means during selected first times;

selectively connecting with said second switching means during selected second times occurring other than at said first times; and generating said SAM column selection signal during third times.

11. A memory device formed on a semiconductor substrate, provided with a random-access-memory port, and provided with a serial-access-memory port, said memory device comprising:

a two-dimensional array of memory cells disposed on a first surface of said semiconductor substrate, said array of memory cells being separated along a first of its dimensions into a plurality of spaced parallel memory blocks of even number 2N at least four, consecutively ordinally numbered first through $(2N+1)^{th}$ in accordance with their occurrence in spaced parallel order in a first direction in said first dimension;

a plurality N in number of serial-access-memory port circuits, consecutively ordinally numbered first through $N^{th}$, each serial-access-memory port circuit disposed on the first surface of said semiconductor substrate flanked by the odd-numbered one of said memory blocks having an ordinal number next lower than twice its own and the even-numbered one of said memory blocks that has an ordinal number twice its own, each serial-access-memory port circuit including respective selective switching circuitry for selectively connecting to either or neither of said memory blocks that flank it; and a plurality N+1 in number of random-access-memory port circuits, consecutively ordinally numbered first through $(N+1)^{th}$ each random-access-memory port circuit disposed on the first surface of said semiconductor substrate, each random-access-memory port circuit flanking a side of a respective one of said memory blocks that is flanked on an opposite side thereof by one of said serial-access-memory port circuits, each of said first and $(N+1)^{th}$ random-access-memory port circuits including respective selective switching circuitry for selectively connecting said memory block that flanks it to that said random-access-memory port, and each of said second through $N^{th}$ random-access-memory port circuits including respective selective switching circuitry for selectively connecting either or neither of said memory blocks that flank it to that said random-access-memory port.

12. A memory device as set forth in claim 11 further comprising:

a SAM column decoder for generating a SAM column selection signal applied to all of said plurality N in number of series-access-memory port circuits.

13. A memory device as set forth in claim 12 further comprising:

a RAM column decoder responsive to a RAM column address for generating a RAM column selection signal applied to all of said plurality N+1 in number of random-access-memory port circuits.

14. A memory device as set forth in claim 11 further comprising:

a RAM column decoder responsive to a RAM column address for generating a RAM column selection signal applied to all of said plurality N+1 in number of random-access-memory port circuits.

15. A memory device formed on a semiconductor substrate, provided with a random-access-memory port, and provided with a serial-access-memory port, said memory device comprising:

a two-dimensional array of memory cells disposed on a first surface of said semiconductor substrate, said array of memory cells being separated along a first of its dimensions into a plurality of spaced parallel memory blocks of even number 2N at least four, consecutively ordinally numbered first through $(2N+1)^{th}$ in accordance with their occurrence in spaced parallel order in a first direction in said first dimension;

a plurality N in number of random-access-memory port circuits, consecutively ordinally numbered first through $N^{th}$, each serial-access-memory port circuit disposed on the first surface of said semiconductor substrate flanked by the odd-numbered one of said memory blocks having an ordinal number next lower than twice its own and the even-numbered one of said memory blocks that has an ordinal number twice its own, each random-access-memory port circuit including respective selective switching circuitry for selectively connecting to either or neither of said memory blocks that flank it; and a plurality N+1 in number of serial-access-memory port circuits, consecutively ordinally numbered first through (N+1), each serial-access-memory port circuit disposed on the first surface of said semiconductor substrate, each serial-access-memory port circuit flanking a side of a respective one of said memory blocks that is flanked on an opposite side thereof by one of said random-access-memory port circuits, each of said first and $(N+1)^{th}$ serial-access-memory port circuits including respective selective switching circuitry for selectively connecting said memory block that flanks it to that said serial-access-memory port, and each of said second through $N^{th}$ serial-access-memory port circuits including respective selective switching circuitry for selectively connecting either or neither of said memory blocks that flank it to that said serial-access-memory port.

16. A memory device as set forth in claim 15 further comprising:

a SAM column decoder for generating a SAM column selection signal applied to all of said plurality N+1 in number of series-access-memory port circuits.

17. A memory device as set forth in claim 16 further comprising:

a RAM column decoder responsive to a RAM column address for generating a RAM column selection signal applied to all of said plurality N in number of random-access-memory port circuits.

18. A memory device as set forth in claim 15 further comprising:

a RAM column decoder responsive to a RAM column address for generating a RAM column selection signal applied to all of said plurality N in number of random-access-memory port circuits.

* * * * *